United States Patent
Fuselier et al.

(10) Patent No.: US 6,410,350 B1
(45) Date of Patent: Jun. 25, 2002

(54) DETECTING DIE SPEED VARIATIONS

(75) Inventors: Mark Brandon Fuselier; Stephen Doug Ray; Michael James Dunn; Roger T. Williams, all of Austin; Michael V. Fenske, Round Rock, all of TX (US)

(73) Assignee: Advanced Micro Devices, Austin, TX (US)

( * ) Notice: Subject to any disclaimer, the term of this patent is extended or adjusted under 35 U.S.C. 154(b) by 30 days.

(21) Appl. No.: 09/607,150

(22) Filed: Jun. 29, 2000

(51) Int. Cl.$^7$ .............................................. H01L 21/66
(52) U.S. Cl. ............................. 438/14; 438/15; 438/18
(58) Field of Search ............................. 438/14, 15, 17, 438/18; 714/718, 814

(56) References Cited

U.S. PATENT DOCUMENTS

| | | | | |
|---|---|---|---|---|
| 4,890,270 A | * | 12/1989 | Griffith ........................ | 368/113 |
| 5,457,400 A | * | 10/1995 | Ahmad et al. ............... | 324/763 |
| 5,912,562 A | * | 6/1999 | Pappert et al. .............. | 324/765 |
| 5,929,650 A | * | 7/1999 | Pappert et al. .............. | 324/763 |
| 6,088,830 A | * | 7/2000 | Blomgren et al. .......... | 714/814 |

* cited by examiner

*Primary Examiner*—Caridad Everhart
(74) *Attorney, Agent, or Firm*—Robert A. Voigt, Jr.; Winstead Sechrest & Minick P.C.

(57) ABSTRACT

An apparatus and method for detecting speed variations across a die, a flash field, i.e., multiple dies, and multiple flash fields. In one embodiment, a method comprises the step of inserting a plurality of functional circuits at strategic locations across a die or flash field or multiple flash fields where each of the plurality of functional circuits generates data, e.g., values, frequency, etc., correlated to the die speeds at the strategic locations. The method further comprises reading the data generated by the plurality of functional circuits that may be correlated to the die speeds at the strategic locations. Speed variations across the die or flash field or multiple flash fields may then be subsequently detected based on the data generated by the plurality of functional circuits. Upon analyzing the data generated by the plurality of functional circuits, adjustments may be made to the manufacturing process to improve the number of acceptable integrated circuits or chips disposed in the dies.

32 Claims, 4 Drawing Sheets

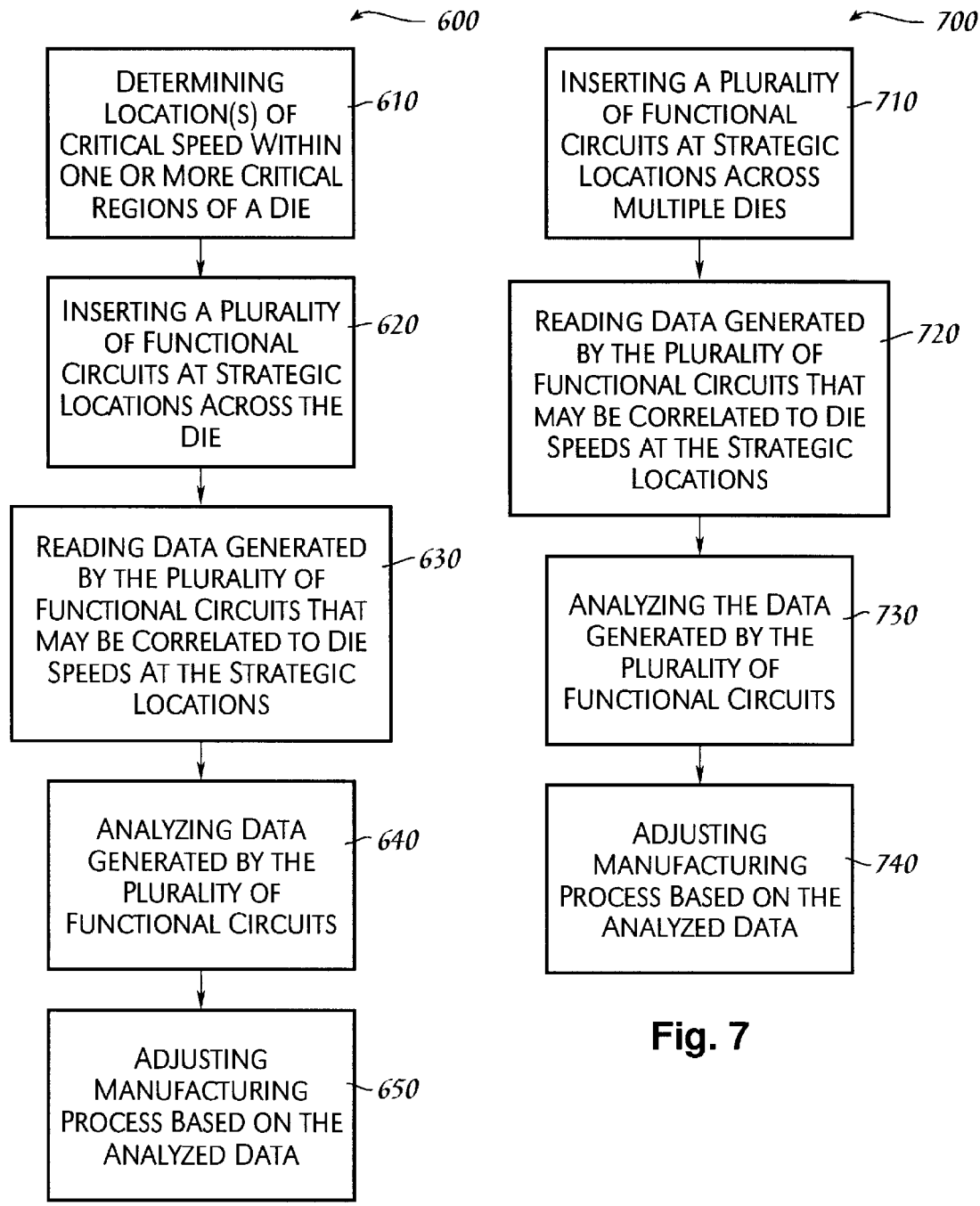

DETECTING DIE SPEED VARIATIONS

TECHNICAL FIELD

The present invention relates to the field of semiconductor device fabrication processes, and more particularly to an apparatus and method for detecting speed variations across at die, a flash field, i.e. multiple dies, and multiple flash fields.

BACKGROUND INFORMATION

Semiconductor devices, such as integrated circuits, are typically formed on a section of a wafer of semiconductor material, such as silicon. The wafer includes multiple sections where each section is called a die. For example, a wafer having an eight-inch diameter may include up to 600 individual dies. Each die has an integrated circuit or chip disposed in the die.

The surface geometry of the various integrated-circuit components on a die is defined photographically. For example, the surface may be coated with a photosensitive layer and then exposed to light through a master pattern on a photographic plate, e.g., photo mask. The main body of the photo mask is a flat and transparent glass plate that defines the circuit pattern which may be 5× the size of the image to be transferred to the surface. The transfer of the image from the photo mask to the surface of the wafer is accomplished through the use of UV light and a photoresist. Photoresists are chemical compositions containing a light-sensitive material in suspension. Photoresists are coated on the wafer using a variety of techniques, e.g., contact printing, spinning.

One technique for exposing the photoresist is the "step and repeat" exposure. The equipment used for this technique is called a stepper. The stepper has a lens that photo reduces the image of a circuit pattern on the photo mask (reticle) onto a photosensitive substrate by a step and repeat scheme. A circuit pattern on a reticle is reduced and projected at a predetermined position (shot) onto a wafer surface through a projection optical system having a predetermined reduction ratio to be transferred. During the duration of the flash or exposure dose, multiple dies, i.e., "flash field", may be flashed at one time. After the projection and transformation are performed once, the stage on which the wafer is placed is moved by a predetermined amount to transfer the image on another shot. These steps are repeated to entirely expose the wafer. The step and repeat process results in rows and columns of identical images. A similar technique uses a scanner to selectively expose layers of photoresist using slit-like exposure areas.

Unfortunately these techniques result in distortion or nonlinearity in the integrated circuits. These distortions may result in speed variations across the die. For example, the speed of the chip may be at different rates in different regions of the chip. If the speed in one region of the chip is unacceptable, then the chip is bad and marked for later identification. Hence, variations in the die speed affect yield and speed limitations. It is noted that variations in the die speed may be caused by other factors occurring in any stage in the manufacturing process, e.g., oxidation, diffusion, deposition, patterning and etching.

One technique of attempting to quantify these variations implement scribe line monitors Scribe line monitors are placed in circuit-free street areas between the dies where the dies are detached, i. e, cut, removed, or scribed. Unfortunately, this technique only provides you with speed Variation information outside the die and not within tho die.

It would therefore be desirable to quantify these variations in die speed from data collected within the die and adjust the manufacturing process so as to improve the number of acceptable integrated circuits or chips disposed in the dies.

SUMMARY OF THE INVENTION

The problems outlined above may at least in part be solved in some embodiments by inserting a plurality of functional circuits at strategic locations across a die or a flash field, i.e., multiple dies, or multiple flash fields, where each of the plurality of functional circuits generate data, e.g., values, frequency, etc., that may be correlated to the die speeds at the strategic locations. Speed variations across the die, or flash field, or multiple flash fields may then be detected based on the data generated by the plurality of functional circuits. Upon analyzing the data generated by the plurality of functional circuits, the manufacturing process may then be adjusted, e.g., changing the exposure dose such as adjusting the exposure of a scanner or limiting the exposure field of a stepper.

In one embodiment, a method for detecting speed variations across a die comprises the step of determining at least one location of at least one critical region of the die. A critical region of the die is the location of a critical speed of the die. The method further comprises inserting a plurality of functional circuits at strategic locations across the die where each of the plurality of functional circuits generates data correlated to the die speeds at the strategic locations. The method further comprises reading the data of the plurality of functional circuits that is correlated to the die speeds at the strategic locations. Speed variations across the die are subsequently detected based on the data generated by the plurality of functional circuits.

In another embodiment of the present invention, a method for detecting speed variations across a flash field comprises the step of inserting a plurality of functional circuits at strategic locations across the flash field comprising multiple dies. Each of the plurality of functional circuits generates data correlated to the die speeds at the strategic locations. The method further comprises reading the data of the plurality of functional circuits that is correlated to the die speeds at the strategic locations. Speed variations across the flash field are subsequently detected based on the data generated by the plurality of functional circuits.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which:

FIG. 6 is a flowchart depicting a method for detecting speed variations across a die; and FIG. 7 is a flowchart depicting a method for detecting speed variations across a flash field.

DETAILED DESCRIPTION

The present invention comprises an apparatus and method for detecting speed variations across a die, a flash field, and multiple flash fields. In one embodiment of the present invention a plurality of functional circuits are inserted at strategic locations across a die where each of the plurality of functional circuits generate data, e.g., values, frequency, etc., that is correlated to the die speeds at the strategic locations. Speed variations across the die may then be detected based on the data generated by the plurality of functional circuits. Upon analyzing the data generated by the plurality of functional circuits, adjustments may be made to the manufacturing process to improve the number of acceptable integrated circuits or chips disposed in the dies. In another embodiment of the present invention, functional circuits are inserted at strategic locations across multiple dies commonly referred to as a flash field. In another embodiment of the present invention, functional circuits are inserted at strategic locations across multiple flash fields.

Figure 1:
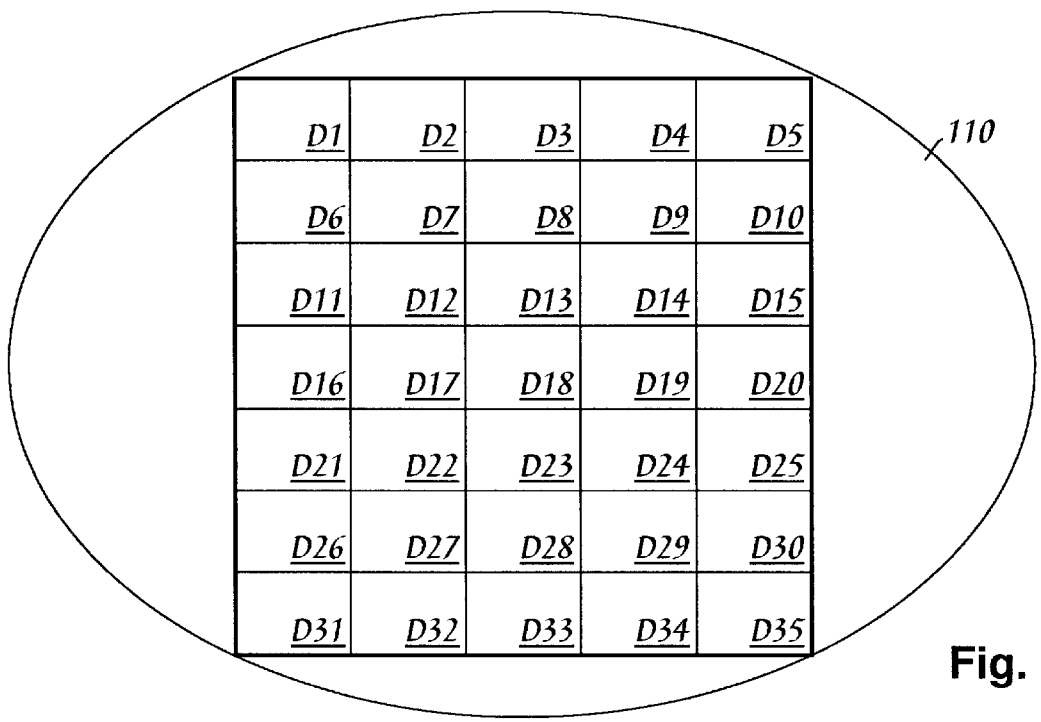
FIG. 1 illustrates a plain view of a semiconductor wafer comprising a plurality of dies.

FIG. 1—Wafer with a Plurality of Dies

FIG. 1 illustrates a wafer 110 comprising a plurality of sections called dies labeled D1–D35. Semiconductor devices, such as integrated circuits or chips are disposed, e.g, printed, in these dies. It is noted that wafer 10 may comprise any number of dies and that dies labeled D1–D35 are illustrative.

As described in the background section, integrated circuits or chips after they are disposed in the dies, e.g., D1–D35, may possess speed variations across the chip from any factor occurring in any stage in the manufacturing process. It would therefore be desirable to quantify these variations in die speed and adjust the manufacturing process so as to improve the number of acceptable integrated circuits or chips disposed in the dies. The problem with die speed variation may at least in part be solved in some embodiments by placing a plurality of functional circuits at strategic locations in the die as discussed below.

Figure 2:
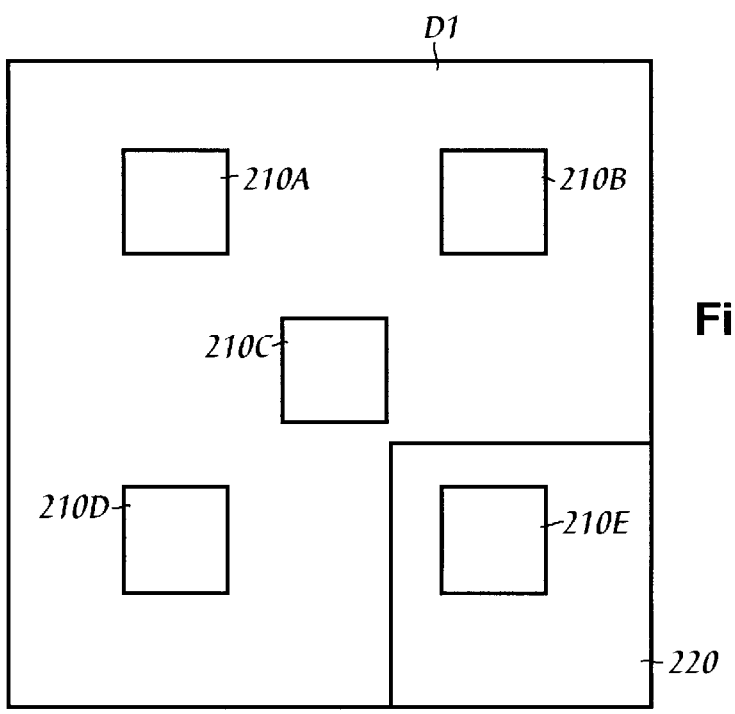
FIG. 2 illustrates an embodiment of detecting speed variations across a die.

FIG. 2—Embodiment of Detecting Speed Variations Across a Die

FIG. 2 illustrates an embodiment of the present invention where a plurality of functional circuits 210A–E are inserted in strategic locations across a particular die, e. g., D1 Functional circuits 210A–E may collectively or individually be referred to as functional circuits 210 or functional circuit 210, respectively Functional circuits 210 may be configured to generate data that is correlated to the speed of the integrated circuit at the strategic locations Functional circuits 210 may comprise ring oscillators, discrete Transistors, analog circuits, delay lines, etc. as long as the circuit measures the speed of the integrated circuit at the strategic locations. It is noted that any number of functional circuits 210 may be inserted in the die and that FIG. 2 is illustrative.

In an embodiment of the present invention, at least one functional circuit 210 may be inserted in a region commonly referred to as a critical region 220. Critical region 220 of the die, e.g., D1, or integrated circuit is the location of a critical speed of the integrated circuit. As illustrated in FIG. 2, critical region 220 is located in the lower right hand corner of die D1. It is noted that critical region 220 may be located in any part of a die. It is further noted that multiple critical regions 220 may be located in a particular die.

In an embodiment of the present invention, the data generated by functional circuits 210 may then be read such as with a meter and analyzed to determine the speed variations across the die, e.g., D1, and consequently adjust the manufacturing process so as to improve the number of acceptable integrated circuits or chips disposed in the dies. Adjustments to the manufacturing process may include changing the exposure dose such as adjusting the exposure of a scanner or limiting the exposure field of a stepper.

Figure 3:
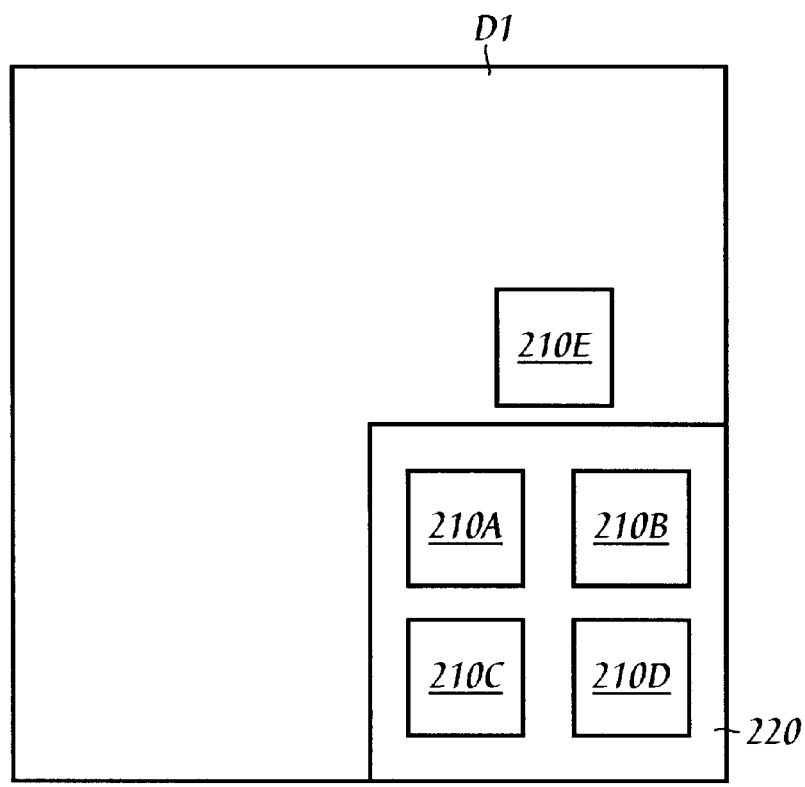
FIG. 3 illustrates another embodiment of detecting speed variations across a die.

FIG. 3—Alternative Embodiment of Detecting Speed Variations Across a Die

FIG. 3 illustrates another embodiment of the present invention where functional circuits 210A–E may be grouped in an area within and around at least one critical region 220 in a particular die, e.g., D1, deemed to include a critical speed component of the integrated circuit. It is noted that functional circuits 210A–E may be grouped in an area within or around at least one critical region 220 in a particular die, e.g., D1. It is further noted that any number of functional circuits 210 may be inserted in the area within and/or around at least one critical region 220. It is further noted that any number of critical regions 220 may be located in a particular die.

Similarly as with the embodiment of FIG. 2, the data generated by functional circuits 210 may be read and analyzed to determine the speed variations and consequently adjust the manufacturing process so as to improve the number of acceptable integrated circuits or chips disposed in the dies.

Figure 4:
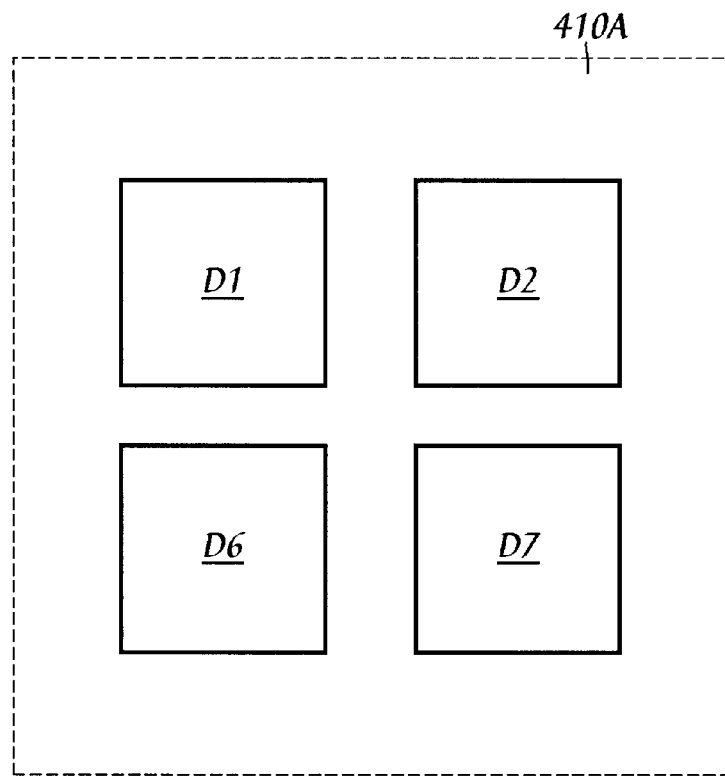
FIG. 4 illustrates an embodiment of detecting speed variations across a flash field.

FIG. 4—Embodiment of Detecting Speed Variations Across a Flash Field

FIG. 4 illustrates another embodiment of the present invention where die speed variations are detected across multiple dies, e.g., four dies During the photolithography process implementing either a "step and repeat" or a "scan and repeat" technique, multiple dies, commonly referred to as the "flash field", may be printed at one time during a period of time. FIG. 4 illustrates a flash field 410A comprising multiple dies, e.g., D1, D2, D6 and D7, which have all been printed at the same time. It is noted that flash field 410A may comprise any number of dies and that flash field 410A is illustrative.

Die D1, D2, D6 and D7 comprise a plurality of functional circuits 210 that may be inserted in strategic locations across each particular die as illustrated in FIGS. 2 and 3. It is noted that functional circuits 210 may be inserted in other patterns than as illustrated in FIGS. 2 and 3. In one embodiment, functional circuits 210 may not necessarily be inserted within and/or around at least one critical region in at least one of the die of flash field 410A. For example, functional circuits 210 may be inserted at the edges of each die, e.g., lower right hand corner of D1, lower left hand corner of D2, upper right hand corner of D6 and upper left hand comer of D7, of flash field 410A which may not necessarily be within and/or around the critical region of that respective die in order to detect spatial variations, space or width variations, temperature variations, diffusion and implant placement effects, etc. In one embodiment, functional circuits 210 may be configured to generate data that may be correlated to the speed of the integrated circuit at the strategic locations. Speed variations may then be detected across flash field 410A by reading and analyzing the data generated by functional circuits 210. Once the data is analyzed, the manufacturing process may then be adjusted accordingly.

Figure 5:
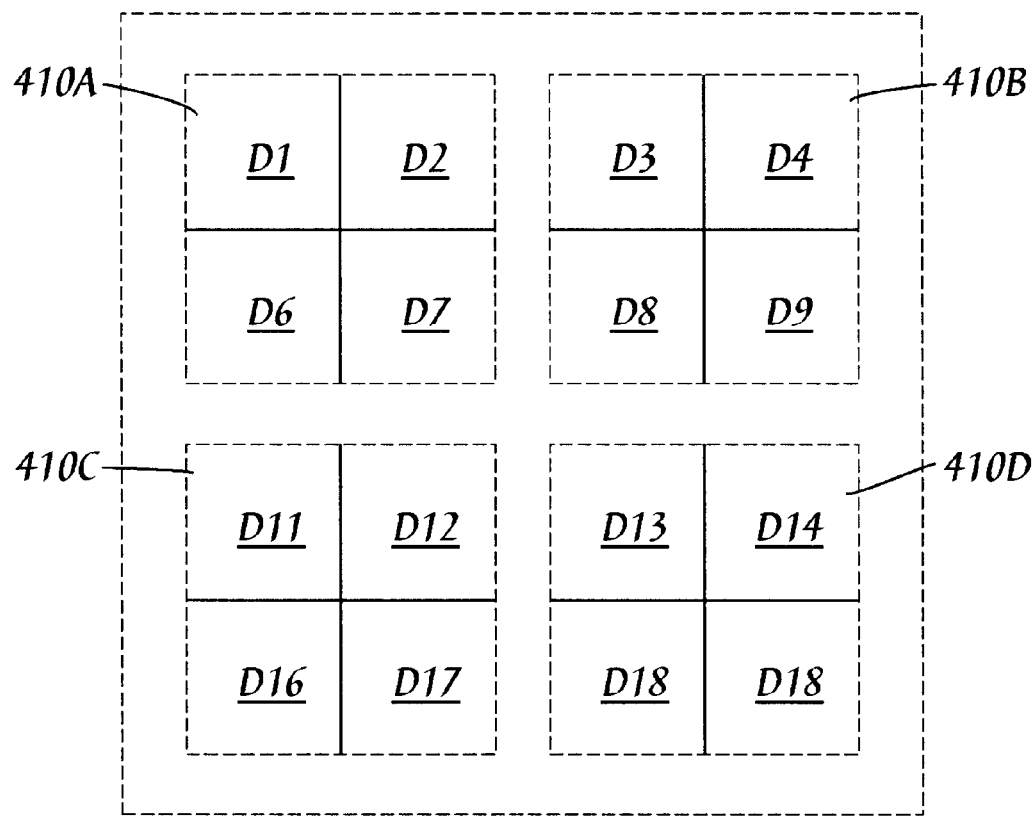
FIG. 5 illustrates an embodiment of detecting speed variations across multiple flash fields.

FIG. 5—Embodiment of Detecting Speed Variations Across Multiple Flash Fields FIG. 5 illustrates another embodiment of the present invention where die speed variations are detected across multiple flash fields, e.g., 410A–410D on wafer 110. Flash fields 410A–D may collectively or individually be referred to as flash fields 410 or flash field 410, respectively. It is noted that any number of flash fields 410 may exist on wafer 110.

Each flash field 410 may comprise any number of dies, e.g., four dies, where each die may comprise a plurality of functional circuits 210. Functional circuits 210 may be inserted at strategic locations across each particular die as illustrated in FIGS. 2 and 3. It is noted that functional circuits 210 may be inserted in other patterns than as illustrated in FIGS. 2 and 3. In one embodiment, functional circuits 210 may not necessarily be inserted within and/or around at least one critical region in at least one of the die in at least one of the flash fields 410. For example, functional circuits 210 may be inserted at the edges of each die of each flash field, e.g., lower right hand corner of D1, D3, D11 and D13; lower left hand corner of D2, D4, D12, and D14; upper right hand corner of D6, D8, D16, and D18; and upper left hand corner of D7, D9, D17, and D19 of flash fields 410A, 410B, 410C, and 410D, respectively, which may not necessarily be within and/or around the critical region of that respective die in order to detect spatial variations, space or width variations, temperature variations, diffusion and implant placement effects, etc., across flash fields 410A–D. In one embodiment, functional circuits 210 may be configured to generate data that may be correlated to the speed of the integrated circuit at strategic locations. Speed variations may then be detected across multiple flash fields, e.g., 410A–D, by reading and analyzing the data generated by functional circuits 210. Once the data is analyzed, the manufacturing process may then be adjusted accordingly.

FIG. 6—Method for Detecting Speed Variations Across a Die

FIG. 6 illustrates a method 600 according to an embodiment of the present invention. FIG. 6 is a method 600 for detecting speed variations across a die. In step 610, at least one location of a critical speed within at least one region, i.e., critical region, of a particular die may be determined. It is noted that multiple critical regions may be located in a particular die. In step 620, a plurality of functional circuits 210 may be inserted at strategic locations across the die. In a particular embodiment, at least one of a plurality of functional circuits 210 may be inserted in at least one critical region. For example, if the critical speed element of the integrated circuit is the memory which is located in the lower right hand corner, then at least one functional circuit is placed in the lower right hand corner of the die where the memory is located.

In steps 630 and 640, the data generated by the functional circuits, which may be correlated to the die speeds at the strategic locations, will be read and analyzed to determine the die speed variations across the die, respectively. Once the data generated by functional circuits 210 is analyzed, adjustments may be made to the manufacturing process as in step 650. Adjustments may include, but are not limited to, changing the exposure dose in the photolithography process, e.g., adjusting the exposure of a scanner or limiting the exposure field of a stepper.

FIG. 7—Method for Detecting Speed Variations Across a Flash Field

FIG. 7 illustrates a method 700 according to another embodiment of the present invention. FIG. 7 is a method 700 of detecting speed variations across flash field 410. As stated above, during the flash of the reticle, a stepper or scanner will print the circuit pattern on the reticle onto multiple dies at one time. In step 710, a plurality of functional circuits 210 may be inserted at strategic locations across multiple dies, i.e., flash field 410. In one embodiment, at least one of the plurality of functional circuits 210 will be inserted in at least one of the critical regions in at least one of the die of flash field 410. In another embodiment, functional circuits 210 may be inserted in strategic locations across each die of flash field 410 which may not necessarily be within and/or around a critical region of any of the die of flash field 410 to detect spatial variations, space or width variations, temperature variations, diffusion and implant placement effects, etc.

In steps 720 and 730, the data generated by functional circuits 210, which may be correlated to the die speeds at the strategic locations, will be read and analyzed to determine the speed variations across flash field 410, respectively. Once the data generated by functional circuits 210 is analyzed, adjustments may be made to the manufacturing process as in step 740. Adjustments may include, but are not limited to, changing the exposure dose in the photolithography process, e.g., adjusting the exposure of a scanner or limiting the exposure field of a stepper. For example, a stepper may be adjusted to print two instead of four dies.

Although the apparatus and method of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

What is claimed is:

1. A method of detecting speed variations across a die comprising the steps of:
   determining at least one location of at least one critical region of said die;
   inserting a plurality of functional circuits at strategic locations across said die; wherein each of said plurality of functional circuits generate data correlated to die speeds at said strategic locations; and
   reading data generated by said plurality of functional circuits that is correlated to die speeds at said strategic locations, wherein speed variations across said die are detected based on said data generated by said plurality of functional circuits.

2. The method as recited in claim 1, wherein said at least one critical region is the location of at least one critical speed of said die.

3. The method as recited in claim 2 further comprising the step of:
   inserting at least one of said plurality of functional circuits in at least one location in said at least one critical region of said die.

4. The method as recited in claim 2 further comprising the step of:
   inserting a group of said plurality of functional circuits within or around said at least one critical region of said die.

5. The method as recited in claim 2 further comprising the step of:
   inserting a group of said plurality of functional circuits within and around said at least one critical region of said die.

6. The method as recited in claim 1 further comprising the step of:
   analyzing data generated by said plurality of functional circuits.

7. The method as recited in claim 1 further comprising the step of:
   adjusting a manufacturing process based on said analyzed data.

8. The method as recited in claim 7, wherein said step of adjusting said manufacturing process comprises the step of changing the exposure dose.

9. The method as recited in claim 7, wherein said step of adjusting said manufacturing process comprises the step of limiting the exposure field of a stepper.

10. The method as recited in claim 7, wherein said step of adjusting said manufacturing process comprises the step of adjusting the exposure of a scanner.

11. The method as recited in claim 1, wherein each of said plurality of functional circuits is a ring oscillator circuit.

12. The method as recited in claim 1, wherein each of said plurality of functional circuits is a discrete transistor.

13. The method as recited in claim 1, wherein each of said plurality of functional circuits is an analog circuit.

14. The method as recited in claim 1, wherein each of said plurality of functional circuits is a delay line.

15. A method of detecting speed variations across a flash field comprising:
   inserting a plurality of functional circuits at strategic locations across said flash field comprising multiple dies, wherein each of said plurality of functional circuits generate data correlated to die speeds at said strategic locations; and
   reading data generated by said plurality of functional circuits that is correlated to die speeds at said strategic locations, wherein speed variations across said flash field are detected based on said data generated by said plurality of functional circuits.

16. The method as recited in claim 15 further comprising the step of:
   analyzing data generated by said plurality of functional circuits.

17. The method as recited in claim 16 further comprising the step of:
   adjusting a manufacturing process based on said analyzed data.

18. The method as recited in claim 15 further comprising the step of:
   inserting at least one of said plurality of functional circuits in at least one location of at least one critical region in at least one of said multiple dies, wherein said at least one critical region is the location of at least one critical speed of one of said multiple dies.

19. The method as recited in claim 15 further comprising the step of:
   inserting a group of said plurality of functional circuits within or around at least one critical region in at least one of said multiple dies, wherein said at least one critical region is the location of at least one critical speed of one of said multiple dies.

20. The method as recited in claim 15 further comprising the step of:
   inserting a group of said plurality of functional circuits within and around at least one critical region in at least one of said multiple dies, wherein said at least one critical region is the location of at least one critical speed of one of said multiple dies.

21. An apparatus for detecting die speed variations across a die comprising:
   a semiconductor wafer, wherein said semiconductor wafer comprises a plurality of dies; and
   a plurality of functional circuits inserted at strategic locations across said die, wherein each of said plurality of functional circuits generates data correlated to die speeds at said strategic locations, wherein speed variations across said die are detected based on said data generated by said plurality of functional circuits.

22. The apparatus as recited in claim 21, wherein at least one of said plurality of functional circuits is inserted in at least one location of at least one critical region of said die, wherein said at least one critical region is the location of at least one critical speed of said die.

23. The apparatus as recited in claim 21, wherein a group of said plurality of functional circuits is inserted within or around at least one critical region of said die, wherein said at least one critical region is the location of at least one critical speed of said die.

24. The apparatus as recited in claim 21, wherein a group of said plurality of functional circuits is inserted within and around at least one critical region of said die, wherein said at least one critical region is the location of at least one critical speed of said die.

25. The apparatus as recited in claim 21, wherein each of said plurality of functional circuits is a ring oscillator circuit.

26. The apparatus as recited in claim 21, wherein each of said plurality of functional circuits is a discrete transistor.

27. The apparatus as recited in claim 21, wherein each of said plurality of functional circuits is an analog circuit.

28. The apparatus as recited in claim 21, wherein each of said plurality of functional circuits is a delay line.

29. An apparatus for detecting die speed variations across a flash field comprising:
   a semiconductor wafer, wherein said semiconductor wafer comprises a plurality of dies; and
   a plurality of functional circuits inserted at strategic locations across said flash field, wherein said flash field comprises multiple dies, wherein each of said plurality of functional circuits generates data correlated to die speeds at said strategic locations, wherein speed variations across said flash field are detected based on said data generated by said plurality of functional circuits.

30. The apparatus as recited in claim 29, wherein at least one of said plurality of functional circuits is inserted in at least one location of at least one critical region of at least one of said multiple dies, wherein said at least one critical region is the location of at least one critical speed of one of said multiple dies.

31. The apparatus as recited in claim 29, wherein a group of said plurality of functional circuits is inserted within or around at least one critical region of at least one of said multiple dies, wherein said at least one critical region is the location of at least one critical speed of one of said multiple dies.

32. The apparatus as recited in claim 29, wherein a group of said plurality of functional circuits is inserted within and around at least one critical region of at least one of said multiple dies, wherein said at least one critical region is the location of at least one critical speed of one of said multiple dies.

* * * * *